United States Patent [19]
Heo

[11] Patent Number: 5,981,873
[45] Date of Patent: Nov. 9, 1999

[54] PRINTED CIRCUIT BOARD FOR BALL GRID ARRAY SEMICONDUCTOR PACKAGE

[75] Inventor: Young Wook Heo, Seoul, Rep. of Korea

[73] Assignees: Anam Semiconductor Inc., Rep. of Korea; Amkor Technology, Inc., Chandler, Ariz.

[21] Appl. No.: 08/882,248

[22] Filed: Jun. 25, 1997

[30] Foreign Application Priority Data

Dec. 27, 1996 [KR] Rep. of Korea ............... 96-74120

[51] Int. Cl.⁶ ............................................... H01L 23/28
[52] U.S. Cl. ..................... 174/52.2; 257/787; 361/760
[58] Field of Search ........................... 174/52.1, 52.2, 174/52.3, 52.4; 29/827, 841; 257/787, 667; 361/760

[56] References Cited

U.S. PATENT DOCUMENTS

| | | | |
|---|---|---|---|
| 5,517,056 | 5/1996 | Bigler et al. | 257/666 |
| 5,635,671 | 6/1997 | Freyman et al. | 174/52.2 |

*Primary Examiner*—Kristine Kincaid
*Assistant Examiner*—William Silverio
*Attorney, Agent, or Firm*—Skjerven, Morrill, MacPherson, Franklin & Friel LLP

[57] ABSTRACT

A printed circuit board for a BGA semiconductor package provided at one corner thereof with a degating opening serving as a mold runner gate during a process of molding a resin seal adapted to protect the semiconductor chip and serving as a region for degating a surplus resin formed after the molding process and a method for molding a BGA semiconductor using the printed circuit board. The degating opening has an inverted triangular shape having curved lateral sides and a vertex, at which the lateral sides join together, disposed in a region for forming the resin seal, or an inverted trapezoidal shape having one end disposed in the resin seal region. The invention can eliminate the peeling or damage of the upper surface of the printed circuit board occurring upon degating a surplus resin, the damage of the printed circuit board due to a torsion thereof, the damage of conductive traces on the printed circuit board, the exposure of the conductive traces caused by the damage of a solder mask, and the damage of a resin seal on the printed circuit board. Therefore, an improvement in productivity and reliability is achieved.

4 Claims, 5 Drawing Sheets

PRINTED CIRCUIT BOARD FOR BALL GRID ARRAY SEMICONDUCTOR PACKAGE

RELATED APPLICATION

This application relates to U.S. Ser. No. 08/756,777 filed Nov. 26, 1996 by Bruce J. Freyman et al. which application has the same assignee as subject application.

BACKGROUND OF THE INVENTION

1. Field of the Invention

The present invention relates to a printed circuit board for a ball grid array (BGA) semiconductor package and a method for molding a BGA semiconductor package using the printed circuit board. More particularly, the present invention relates to a printed circuit board for a BGA semiconductor package provided at one corner thereof with a degating opening serving as a mold runner gate and as a degating region and a method for molding a BGA semiconductor package using the printed circuit board.

2. Description of the Prior Art

Typically, BGA semiconductor packages have a configuration including a printed circuit board, at least one semiconductor chip mounted on one surface of the printed circuit board, and an array of solder balls attached to the other surface of the printed circuit board and adapted to electrically connect the semiconductor chip to a mother board. Such BGA semiconductor packages have been widely used as multi-pin devices having 200 pins or more, integrated circuits of very large scale integration (VLSI) and microprocessors.

Referring to FIG. 1, a typical BGA semiconductor package is illustrated. As shown in FIG. 11 the BGA semiconductor package, which is denoted by the reference numeral 100, includes a printed circuit board 130 having a die pad 132 at the central portion of its upper surface. A semiconductor chip 150 is mounted on the die pad 132 of the printed circuit board 130 by means of an epoxy adhesive. The semiconductor chip 150 is provided with bond pads (not shown) electrically connected to conductive traces 133 of the printed circuit board 130 by bonding wires 140. A resin seal 120 is molded on the printed circuit board 130 to protect the semiconductor chip 150 and wires 140 from the external environment. Conductive traces 135 are provided on the printed circuit board 130, and electrically connected to the solder ball pads 136 which are formed at opposite side surface thereof, through via holes 134. Solder balls 160 are fused on the solder ball pads 136 as input/output terminals, respectively.

Such a BGA semiconductor package is fabricated in accordance with the above-mentioned process steps, namely, the semiconductor chip mounting step, wire bonding step, seal molding step and solder ball fusing step.

Now, a conventional seal molding method used in the fabrication of a BGA semiconductor package will be described in conjunction with FIG. 5.

In accordance with this method, a mold 201 is used which includes an upper mold 202 and a lower mold 203. The mold 201 has a cavity 202a in which a printed circuit board 206 to be molded is disposed. The mold 201 also has a mold runner consisting of passages 202b and 202e. In the mold 201, a pot 203b is also defined in which a melt resin is received. The mold runner has a gate defined by a groove formed on the lower surface of the upper mold 202 and a corresponding upper surface portion of the printed circuit board 206 disposed in a recess 203a of the lower mold 203.

The melt resin in the pot 203b is injected into the cavity 202a through the mold runner as it is pushed by a resin feed ram 204. At this time, the melted resin comes into contact with the upper surface portion of the printed circuit board 206 defining the mold runner gate. As a result, a surplus of resin is left on the upper surface portion of the printed circuit board 206 while being connected to a resin seal molded on the printed circuit board 206 after the curing of the resin seal. Accordingly, it is required to remove such a surplus resin. However, the printed circuit board 206 may be peeled off or damaged at its surface during the removal of the surplus resin. The damage of a solder mask may also occur. This may result in an exposure of the conductive traces.

In order to solve these problems, various methods have been proposed. This method is illustrated in FIG. 2. In accordance with this method, a printed circuit board 30', which is a constituting element of a BGA semiconductor package 10', is coated at one corner of its upper surface with a metal, such as platinum, palladium, nickel or silver, exhibiting a bonding strength lower than the upper surface of the printed circuit board 30'. Alternatively, the same corner of the upper surface of the printed circuit board 30' may be attached with a tape. By the coating or tape, a degating region 50 is defined on the printed circuit board 30'. Here, the degating region means a region for easily removing a cured surplus resin left at a mold runner gate which serves as a resin injection passage in a molding process, without any damage of the upper surface of the printed circuit board 30'.

Where a molding process is carried out using a mold shown in FIG. 5 after processing a printed circuit board, to be molded, in accordance with the above-mentioned method, it is possible to easily remove a cured surplus resin left at the degating region 50. In this case, accordingly, it is possible to considerably reduce the above-mentioned problems, namely, the peeling or damage of the upper surface of the printed circuit board or the exposure of the conductive traces caused by the damage of the solder mask.

However, these problems, namely, the peeling or damage of the upper surface of the printed circuit board or the exposure of the conductive traces caused by the damage of the solder mask, are still involved in the above method, even though they are reduced. This is because the degating region 50 defined at one corner of the upper surface of the printed circuit board is relatively large and because the method is only based on the provision of the degating region 50 exhibiting a bonding strength lower than the surface of the printed circuit board. In particular, where the degating region is formed by a tape attached to the printed circuit board, the tape may be melted during a molding process carried out at a high temperature, thereby degrading a stability of the molding process. Consequently, it is difficult to practically use the above-mentioned method.

SUMMARY OF THE INVENTION

Therefore, an object of the invention is to provide a printed circuit board for a BGA semiconductor package provided with a degating opening serving as a mold runner gate and as a degating region, thereby achieving an easy and safe removal of a surplus resin formed in a molding process.

Another object of the invention is to provide a method for molding a BGA semiconductor package using the printed circuit board configured to accomplish the above-mentioned object of the invention, capable of safely and easily removing a surplus resin left in a cured state in the degating opening of the printed circuit board and on a portion of the printed circuit board around the degating opening without any damage of the surface of the printed circuit board.

In accordance with one aspect, the present invention provides a printed circuit board for a ball grid array semiconductor package comprising: a resin substrate; a chip mounting plate centrally provided on an upper surface of the resin substrate, the chip mounting plate serving to mount a semiconductor chip thereon; a plurality of via holes formed at an outer portion of the resin substrate; a plurality of conductive traces arranged around the chip mounting plate, the conductive traces extending through the via holes, respectively; a plurality of solder ball pads provided on a lower surface of the resin substrate, the solder ball pads serving as input/output terminals; and a degating opening formed at one of corners of the resin substrate, the degating opening serving as a mold runner gate during a process of molding a resin seal adapted to protect the semiconductor chip and serving as a region for degating a surplus resin formed after the molding process.

In accordance with another aspect, the present invention provides a method for molding a ball grid array semiconductor package comprising the steps of mounting a semiconductor chip on a printed circuit board, bonding bond pads of the semiconductor chip to conductive traces of the printed circuit board by wires, thereby electrically connecting the semiconductor chip to the printed circuit board, and molding a resin seal adapted to protect the semiconductor chip and wires from the environment, wherein the seal molding step comprises: a mold pressing step of positioning the printed circuit board, which is provided at one corner thereof with a degating opening serving as a mold runner gate and as a region for degating a surplus resin, in a mold including upper and lower molds; a molding step of injecting a melted seal resin into the mold via the degating opening of the printed circuit board, and curing the injected seal resin, thereby forming the resin seal on the printed circuit board; and a surplus resin removing step of applying a slight upward or downward force to a surplus resin left in a cured state in the degating opening and on a portion of the printed circuit board around the degating opening, thereby removing the surplus resin.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

Figure 1:
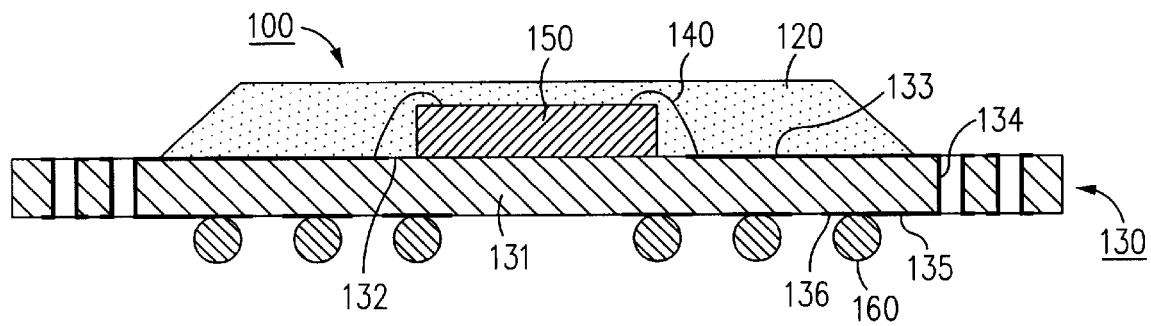
FIG. 1 is a sectional view illustrating a typical BGA semiconductor package.
Figure 2:
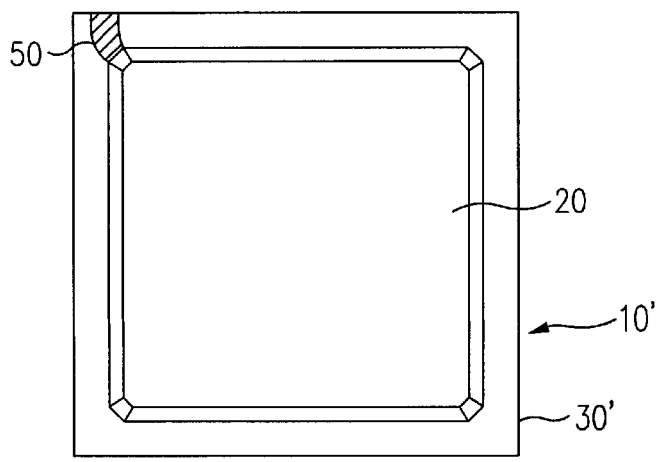
FIG. 2 is a plan view illustrating a convention BGA semiconductor package formed with a metal-coated degating region on its printed circuit board.
Figure 3:
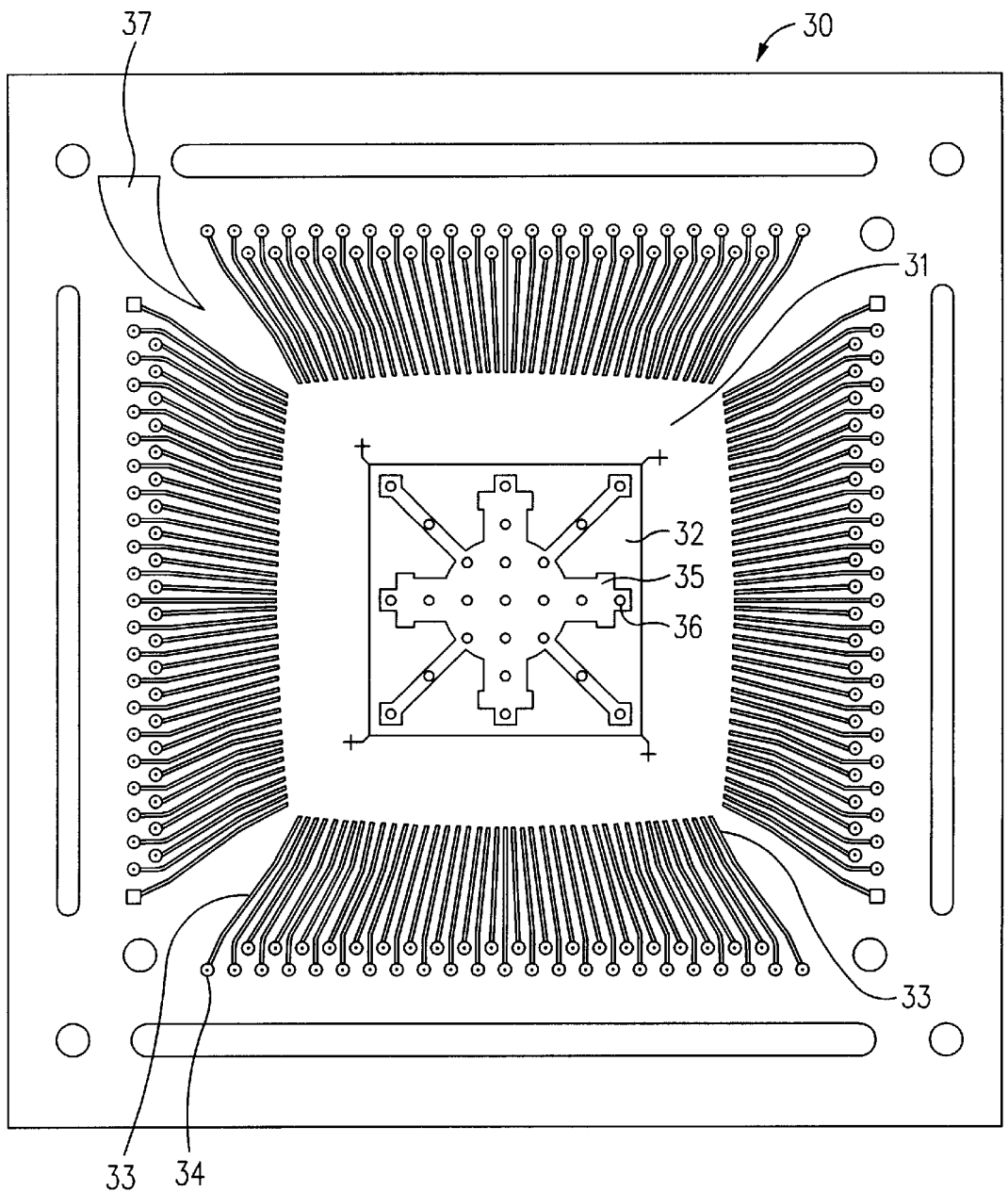
FIG. 3 is a plan view illustrating a printed circuit board for a BGA semiconductor package provided with a degating opening in accordance with the present invention.

Referring to FIG. 3, a printed circuit board for a BGA semiconductor package in accordance with the present invention is illustrated.

As shown in FIG. 3, the printed circuit board, which is denoted by the reference numeral 30, includes a resin substrate 31 made of, for example, bismaleimidetriazine. A chip mounting plate 35 is provided at the central portion of the upper surface of the resin substrate 31. A plurality of conductive traces 33 are arranged around the chip mounting plate 35. A plurality of via holes 34 are formed at the outer portion of the resin substrate 31. The conductive traces 33 extend through the via holes 34, respectively. A plurality of solder ball pads (not shown) are provided on the lower surface of the resin substrate 31. The printed circuit board 30 also includes a degating opening 37 provided at one corner of the resin substrate 31.

The chip mounting plate 35 is typically made of copper. A semiconductor chip (not shown) is mounted on the chip mounting plate 35 by means of an adhesive. The chip mounting plate 35 is coated with a nickel film and a platinum film, in that order. The nickel film and platinum film provides an improved bonding strength of the semiconductor chip to a silver-filled epoxy resin exhibiting a superior thermal conductivity. A plurality of holes 36 are formed at the chip mounting plate 35 to increase a heat discharging efficiency during an operation of the semiconductor chip.

The conductive traces 33 are made of copper and extend along the upper and lower surfaces of the printed circuit board 30 through the via holes 34. The conductive traces include solder ball pads (not shown) on the lower surface of the printed circuit board 30. Solder balls (not shown) are fused on the solder ball pads, respectively. Each conductive trace 33 is provided with a silver-coated finger at its one end disposed on the upper surface of the printed circuit board 30 in order to provide an improvement in electrical conductivity. At the silver-coated finger, the conductive trace 33 is connected to an associated bond pad on the semiconductor chip by means of a wire (not shown) after the fabrication of a semiconductor package. Accordingly, the semiconductor chip is electrically connected with the solder balls, so that its signal inputting and outputting is enabled.

As shown in FIG. 3, the printed circuit board 30 is also provided with slots and holes at its edge portions, respectively. These slits and holes serve to provide an easy cutting of individual semiconductor packages after the fabrication thereof.

The degating opening 37 is formed to have an inverted triangular shape having curved lateral sides, using an appropriate means such as a press. The bottom side of the degating opening 37 is disposed between adjacent slot and hole. This configuration of the degating opening 37 is preferred in that it provides an easy cutting of individual semiconductor packages after the fabrication thereof. The degating opening 37 may extend to an associated edge of the printed circuit board in such a manner that it traverses the portion of the printed circuit board 30 between the associated slot and hole, so that it has an inverted triangular shape having an opened bottom side. In terms of the efficiency of the fabrication of semiconductor packages, the degating opening 37 may have an inverted triangular shape having a closed bottom side, as shown in FIG. 3.

Figure 4:
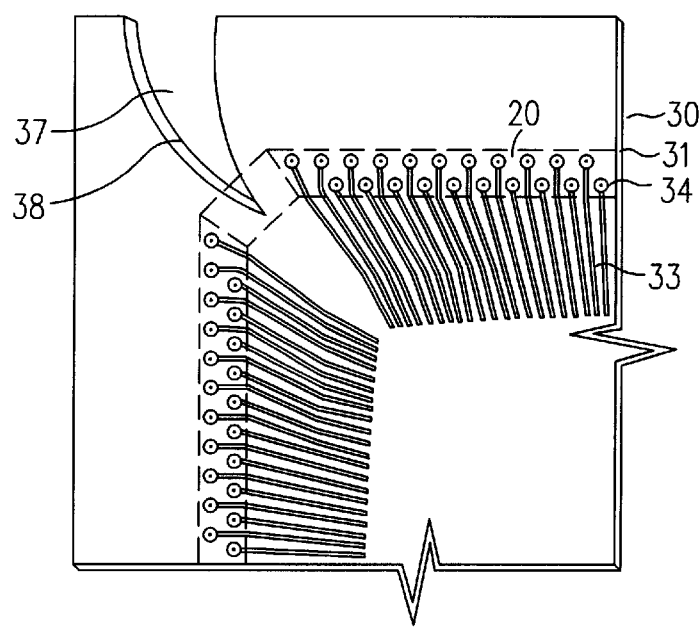
FIG. 4 is a perspective view illustrating a portion of the printed circuit board according to the present invention.

FIG. 4 is a perspective view illustrating a portion of the printed circuit board 30 according to the present invention. As shown in FIG. 4, the degating opening 37 of the printed circuit board 30 has an opened bottom side. The vertex of the degating opening 37, at which opposite lateral sides of the degating opening 37 join together, is disposed in a resin seal region 20 (indicated by a phantom line in FIG. 4) in which the conductive traces 33 and via holes 34 are sealed by a molded resin seal. The vertex portion of the degating opening 37 may be cut. In this case, the degating opening 37 has an inverted trapezoidal shape. Such a configuration is optional in the present invention.

Preferably, the side surfaces 38 of the degating opening 37 are coated with a metal, such as platinum, gold, palladium, nickel or silver, exhibiting a lower bonding force to a molding epoxy resin than that of the resin substrate 31 in order to achieve an easy degating of a surplus resin. In this case, the degating is easily and safely carried out. However, the present invention is not limited to such a coating. Such a coating may also be selectively carried out for the bottom side surface of the degating opening 37.

The position of the degating opening 37 on the printed circuit board 30 is also optional. However, it is most preferable that the degating opening 37 be formed at one of corners of the printed circuit board 30. This is because a corner gating, that is, an injection of seal resin at the corner of the printed circuit board, exhibits a best resin filling profile.

Now, the process of degating a surplus resin will be described in conjunction with FIGS. 7A to 7C. Prior to this description, a molding method according to the present invention will be first described in conjunction with FIG. 6.

Figure 5:
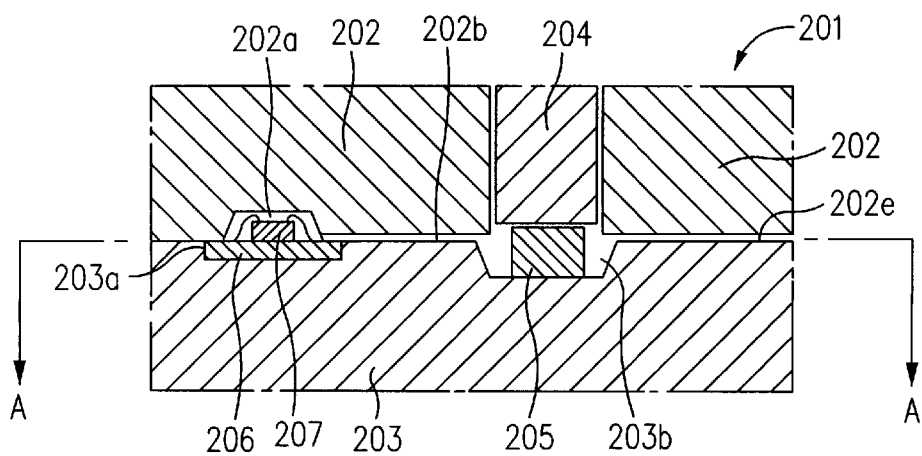
FIG. 5 is a sectional view illustrating a mold used in a molding process for BGA semiconductor packages.
Figure 6:
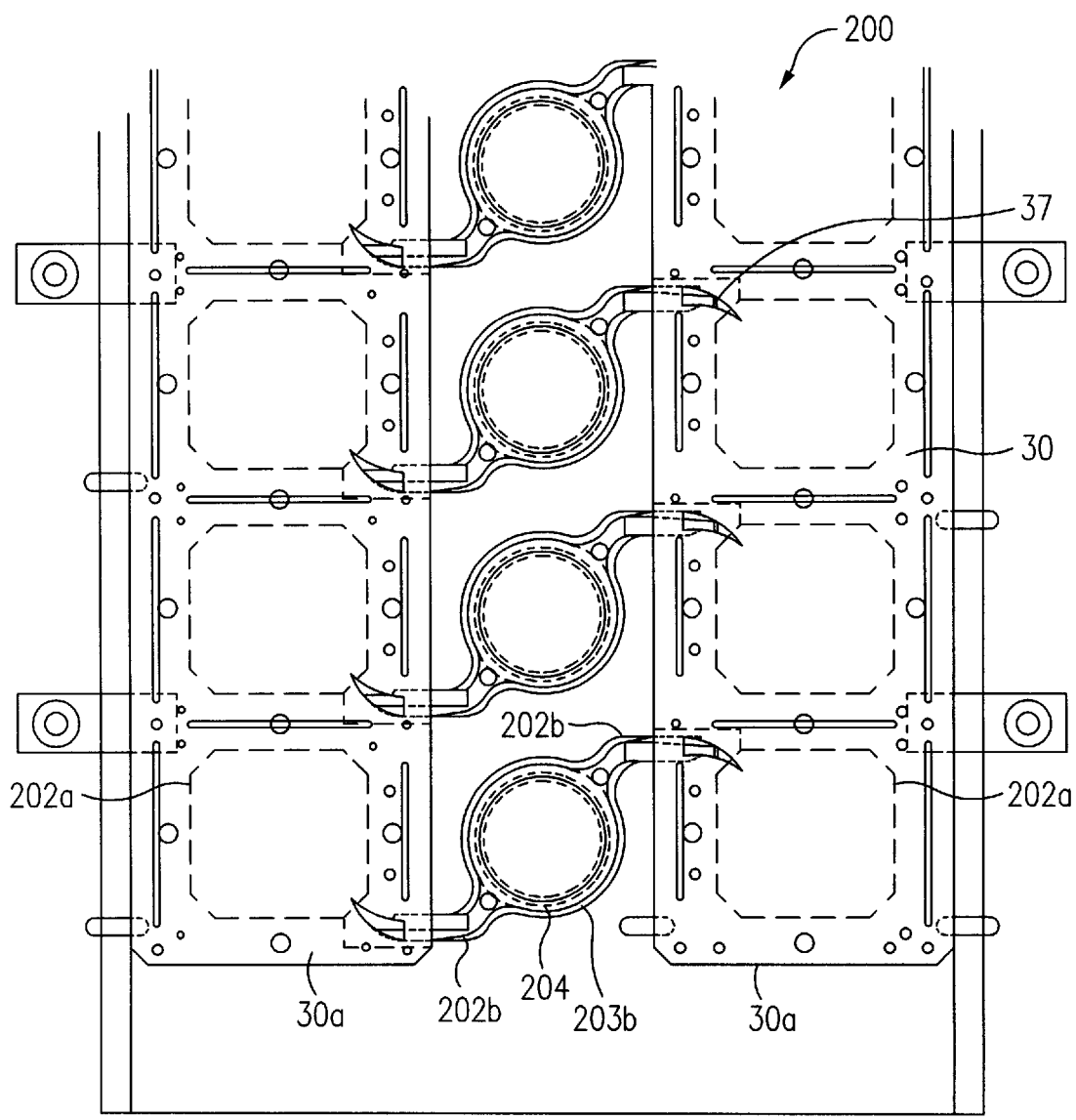
FIG. 6 is a plan view illustrating the mold used in the molding process for BGA semiconductor packages.

In accordance with the molding method according to the present invention, a board strip 30a is first disposed in a mold 200 including upper and lower molds coupled together as shown in FIG. 5. As shown in FIG. 6, a plurality of printed circuit boards 30 each attached with a semiconductor chip (not shown) are arranged as units on the board strip 30a. Each printed circuit board 30 is electrically connected with the associated semiconductor chip. The disposition of the board strip 30a is carried out in such a manner that each mold runner 202b of the mold 200 communicating with a pot 203b filled with a melt seal resin is disposed beneath the degating opening 37 of the associated printed circuit board 30, as shown in FIG. 6. Thereafter, the melt seal resin in each pot 203b is pushed by a resin feed ram 204, so that it is injected into a mold cavity 202a. The injected resin is then cooled so that it is cured. Accordingly, a resin seal (denoted by the reference numeral 20 in FIG. 7) is formed. In this case, a surplus resin sprue (denoted by the reference numeral 21 in FIG. 7) is left in a mold runner region between each pot 203b and each resin seal (disposed in a region denoted by the reference numeral 202a in FIG. 6).

The process of degating the surplus resin 21 will now be described in conjunction with FIGS. 7A to 7C.

Figure 7A:
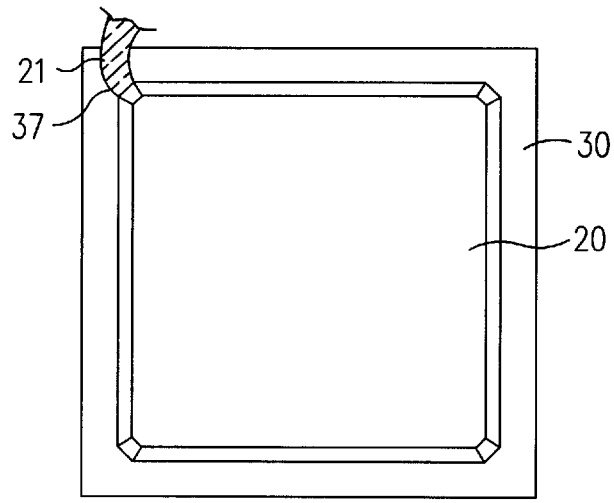
FIG. 7A is a plan view illustrating the condition of a resin seal after its molding using the printed circuit board according to the present invention.

FIG. 7A is a plan view showing the condition of the resin seal after molding the printed circuit board 30 according to the present invention. As shown in FIG. 7A, a surplus resin sprue 21 is left on the printed circuit board 30 in a state in which it is connected to one corner of the resin seal 20. The surplus resin sprue 21 is disposed in the degating opening (not shown) and on the upper surface portion of the printed circuit board 30 around the degating opening.

Figure 7B:
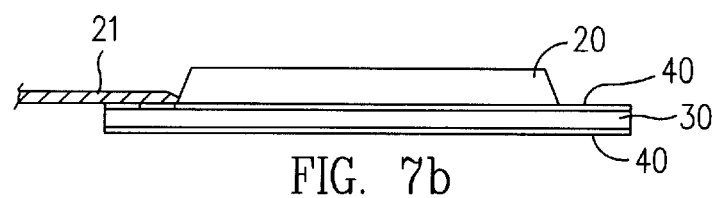
FIGS. 7B and 7C are sectional views respectively explaining a process of cutting a surplus resin left after the molding of a semiconductor package using the printed circuit board according to the present invention.
Figure 7C:
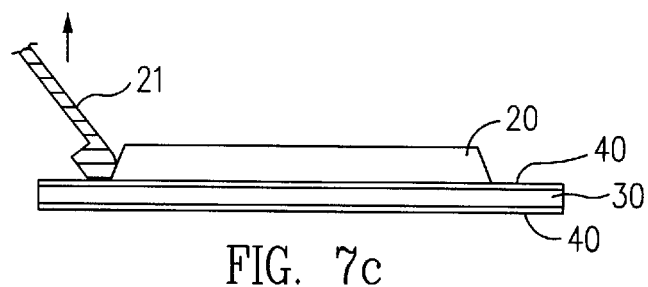

FIGS. 7B and 7C are sectional views explaining the process of cutting the surplus resin 21 left after the molding of a semiconductor package using the printed circuit board 30 according to the present invention, respectively. FIGS. 7B and 7C show a molded state of the printed circuit board 30 in the form of a semiconductor package using the mold of FIG. 6, respectively. In this state, no solder ball is fused on the printed circuit board 30. As shown in FIGS. 7B and 7C, the surplus resin 21 left in the degating opening (not shown), which has served as a runner gate for injecting a melt seal resin, and on the printed circuit board 30 around the degating opening can be easily and safely removed from the printed circuit board 30 by applying a slight upward force to the free end of the surplus resin 21. Accordingly, it is possible to achieve a clean molding finish for the semiconductor package.

As apparent from the above description, in accordance with the present invention, it is possible to achieve a safe and easy degating of a surplus resin formed in a resin seal molding process used for the fabrication of BGA semiconductor packages, using a bottom gate configuration. Accordingly, it is possible to completely prevent problems involved in the conventional methods, namely, the peeling or damage of the upper surface of the printed circuit board occurring upon degating a surplus resin, the damage of the printed circuit board due to a torsion thereof, the damage of conductive traces on the printed circuit board, the exposure of the conductive traces caused by the damage of a solder mask, and the damage of a resin seal on the printed circuit board. Therefore, an improvement in productivity and reliability is achieved.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A printed circuit board for a ball grid array semiconductor package, comprising:

a resin substrate having a plurality of via holes through it;

a chip mounting plate centrally provided on an upper surface of the resin substrate, the chip mounting plate serving to mount a semiconductor chip thereon;

a plurality of conductive traces arranged around the chip mounting plate;

a plurality of solder ball mounting pads provided on a lower surface of the resin substrate and connected to the upper surface of the substrate through said via holes; and, a degating opening formed at one of the corners of the resin substrate, the degating opening serving as a mold runner gate during a process of molding a resin seal adapted to protect the semiconductor chip, and serving as a region for degating a surplus resin sprue formed during the molding process.

2. The printed circuit board in accordance with claim 1, wherein the degating opening has a triangular shape having curved lateral sides joining together to form a vertex, said vertex being disposed in a region for forming the resin seal.

3. The printed circuit board in accordance with claim 1, wherein the degating opening has a trapezoidal shape like a truncated triangle with curvilinear sides the vertex of which triangle is disposed in a region for forming the resin seal.

4. The printed circuit board in accordance with claim 2 or 3, wherein the degating opening defines sidewalls on the substrate inside of the opening which are perpendicular to the upper and lower surfaces of the substrate, and wherein said sidewalls are coated with a metal selected from the group consisting of platinum, gold, palladium, nickel and silver.

* * * * *